US011551778B2

(12) United States Patent
Benedict et al.

(10) Patent No.: US 11,551,778 B2
(45) Date of Patent: Jan. 10, 2023

(54) SYSTEM AND METHOD FOR DETECTING AND REPAIRING DEFECTIVE MEMORY CELLS

(71) Applicant: Hewlett Packard Enterprise Development LP, Houston, TX (US)

(72) Inventors: Melvin K. Benedict, Magnolia, TX (US); Eric L. Pope, Tomball, TX (US)

(73) Assignee: Hewlett Packard Enterprise Development LP, Spring, TX (US)

( * ) Notice: Subject to any disclaimer, the term of this patent is extended or adjusted under 35 U.S.C. 154(b) by 0 days.

(21) Appl. No.: 17/196,758

(22) Filed: Mar. 9, 2021

(65) Prior Publication Data

US 2022/0293207 A1    Sep. 15, 2022

(51) Int. Cl.
G11C 29/44    (2006.01)
G11C 29/54    (2006.01)

(52) U.S. Cl.
CPC ............................... G11C 29/4401 (2013.01)

(58) Field of Classification Search
None
See application file for complete search history.

(56) References Cited

U.S. PATENT DOCUMENTS

| 5,123,016 | A  | * | 6/1992  | Muller  | G11C 29/44 |
|           |    |   |         |         | 714/711    |
| 6,085,334 | A  | * | 7/2000  | Giles   | G11C 29/40 |
|           |    |   |         |         | 714/6.32   |
| 7,293,199 | B1 | * | 11/2007 | Zarrineh | G11C 29/26 |
|           |    |   |         |         | 714/36     |
| 9,798,556 | B2 |   | 10/2017 | Ayyar et al. | |
| 10,303,621 | B1 | * | 5/2019 | Diamant | G06F 12/1408 |
| 10,770,164 | B1 |   | 9/2020  | Baughen et al. | |
| 2002/0062473 | A1 | * | 5/2002 | Tomioka | G11C 5/147 |
|           |    |   |         |         | 365/226    |
| 2003/0037295 | A1 | * | 2/2003 | Galzur | G11C 29/44 |
|           |    |   |         |         | 714/719    |
| 2003/0101370 | A1 | * | 5/2003 | Schroder | G11C 29/808 |
|           |    |   |         |         | 714/6.32   |
| 2003/0208654 | A1 | * | 11/2003 | Krontz | G06F 11/0787 |
|           |    |   |         |         | 710/312    |
| 2005/0005218 | A1 | * | 1/2005 | Braun | G11C 29/12 |
|           |    |   |         |         | 714/733    |
| 2006/0195743 | A1 | * | 8/2006 | Aihara | G01R 31/31813 |
|           |    |   |         |         | 714/738    |
| 2007/0011500 | A1 |   | 1/2007  | Dasari et al. | |
| 2010/0235691 | A1 | * | 9/2010 | Chen | G11C 29/14 |
|           |    |   |         |         | 714/718    |
| 2020/0151070 | A1 |   | 5/2020  | Lee et al. | |
| 2020/0176072 | A1 |   | 6/2020  | Nale | |
| 2022/0147126 | A1 |   | 5/2022  | Chin et al. | |

* cited by examiner

*Primary Examiner* — Cynthia Britt
*Assistant Examiner* — Dipakkumar B Gandhi
(74) *Attorney, Agent, or Firm* — Park, Vaughan, Fleming & Dowler LLP

(57) ABSTRACT

One embodiment provides a memory module that enables online repair of defective memory cells. The memory module includes a memory array storing data, a self-test controller coupled to the memory array and configured to perform a self-test on a region within the memory array without interrupting operations of the memory module, and a memory-repair module configured to repair a defective memory cell identified by the self-test controller.

18 Claims, 7 Drawing Sheets

SYSTEM AND METHOD FOR DETECTING AND REPAIRING DEFECTIVE MEMORY CELLS

BACKGROUND

Field

This disclosure is generally related to dynamic random-access memories (DRAMs). More specifically, this disclosure is related to a system and method for online detection and repair of defective memory cells in DRAMs.

Related Art

Their high speed and the ability to individually access the smallest unit of data make dynamic random-access memories (DRAMs) the main choice when it comes to primary memory for computer systems. The rapid development in the computing technologies also drives the demand for memories with a higher density and a faster access time. The increased density can lead to increased possibility of failure of memory cells (e.g., due to transistor failures).

To increase yield, DRAM developers have developed technologies that can repair defective DRAMs by adding spare rows of memory cells with fusible multiplexers. More specifically, a defective row of memory cells can be replaced by a spare row. Double data rate 3 (DDR3) technology enables a post-package repair (PPR) function that can repair a defective DRAM when it is idle. DDR4 extends the PPR function to a soft PPR (SPPR) function that allows a temporary replacement while the memory system is still running. However, to use PPR or SPPR, software has to track corrections, make policy decisions concerning repair actions, and then schedule the repair actions to program the changes into the defective memory. It is cumbersome and time-consuming.

BRIEF DESCRIPTION OF THE FIGURES

In the figures, like reference numerals refer to the same figure elements.

DETAILED DESCRIPTION

Figure 1:
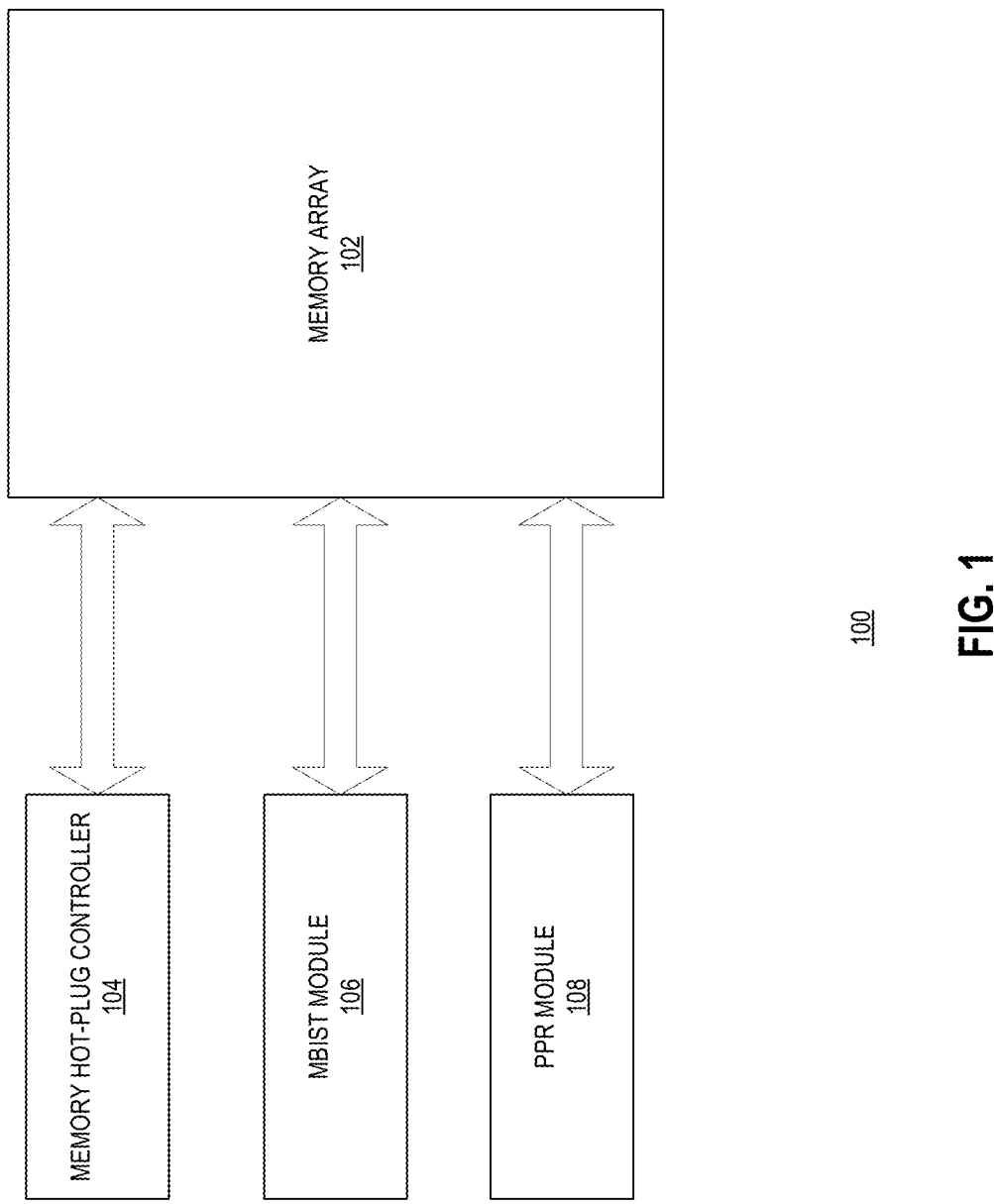
FIG. 1 illustrates an exemplary memory module that enables in-situ memory diagnosis and repair, according to one embodiment.

The following description is presented to enable any person skilled in the art to make and use the embodiments and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the scope of the present disclosure is not limited to the embodiments shown but is to be accorded the widest scope consistent with the principles and features disclosed herein.

The disclosed embodiments provide solutions to the technical problem of locating and repairing defective memory cells in-situ, without requiring the operating system to restart or extending the boot time. More specifically, the solution combines the memory built-in self-test (MBIST) function and the PPR function to achieve in-situ diagnosis and repair. In some embodiments, by enabling hot-plug memory technology, a region within the memory module can be quiesced (either on demand or based on a predetermined schedule), meaning that it becomes unavailable to the operating system. Once idled, the particular memory region can go through the MBIST process to identify weak or failed memory cells, followed by the PPR or SPPR process to repair the identified weak or failed memory cells. After repair, the memory region can be returned to the operating system for normal operations. Compared with existing technologies, this memory diagnosis and repair operation can be performed in the customer environment and does not require the entire memory module to be taken offline or rebooted.

DDR3 enables the PPR function, and DDR4 extends PPR to SPPR to allow in-situ memory repair. The latest DDR4 specification adds the memory built-in self-test (MBIST) routine to the design of a memory module. The existing MBIST solution tests a memory when it is idle using an effective set of algorithms to detect possible faults in memory cells, including stuck-at faults (SAFs), transition delay faults (TDFs), coupling faults (CFs), or neighborhood pattern sensitive faults (NPSFs). Because running the test and subsequently repairing the faulty cells (e.g., using PPR) can be time-consuming (e.g., it may take several minutes to test one memory module), MBIST is often done in the manufacturing environment, before the memory module is shipped to customers. Once the memory module is put into service, it is still possible that certain cells may become weaker or fail. Hence, it is important to have the ability to perform memory diagnosis and repair in the customer setting. Note that it is possible to run the MBIST during system reboot. However, that can significantly increase the boot time due to the time required to execute the MBIST.

To enhance the reliability of a memory module without negatively affecting its performance, in some embodiments, the existing MBIST and PPR (including SPPR) features can be slightly modified to allow on demand in-situ memory diagnosis and repair. More particularly, the modified MBIST function, in combination with the modified PPR/SPPR function, can be used in an operating system without restarting the system or extending the boot time to diagnose and repair weak or faulty memory locations.

FIG. 1 illustrates an exemplary memory module that enables in-situ memory diagnosis and repair, according to one embodiment. In FIG. 1, memory module 100 can include a memory array 102, a memory hot-plug controller 104, an MBIST module 106, and a PPR module 108.

In some embodiments, memory module 100 can be a DRAM module, and memory array 102 can include many DRAM memory cells that are connected to form a two-dimensional array. For simplicity of illustration, other standard functional blocks, such as address decoders and read or write modules are not shown in FIG. 1.

Memory hot-plug controller 104 can be responsible for quiescing and unquiescing memory regions within memory module 100, while memory module 100 is still running. In other words, memory hot-plug controller 104 can "unplug" a portion of memory module 100 without unplugging memory module 100 itself. Memory hot-plug controller 104 can include hardware logic or a software module having similar functionalities. The quiesced memory region becomes inaccessible or unavailable to the operating system. Similarly, memory hot-plug controller 104 can return the unplugged portion of the memory to the operating system without disrupting operations of memory module 100.

Depending on the implementation, memory hot-plug controller 104 can be part of a trusted application, firmware, system BIOS, or memory driver associated with memory module 100. For example, a trusted application running on the memory platform to which memory module 100 is attached can monitor the error state of memory module 100 (e.g., based on the output of an error-correction code (ECC) module). In response to detecting a correctable error, the application can quiesce a region of memory surrounding the detected error. Alternatively, the application can walk through the various regions in memory module 100 to quiesce memory regions of a predetermined size sequentially in a way similar to the periodic refresh operations performed on memories or periodic scrub for memory errors. The size of the memory region being quiesced can be determined based on the size of available memory on memory module 100. Because the quiesced or isolated memory region is no longer available to the operating system, the size of the quiesced memory region needs to be small enough such that the normal operations and performance of memory module 100 are not affected. On the other hand, because the self-test can take a long time, testing a larger memory region each time can increase the test efficiency. In some embodiments, the size of the quiesced memory region can be between 0.5% and 5% of the size of the available memory. In one embodiment, the size of the quiesced memory region can be 1% of the size of the available memory.

MBIST module 106 can perform a self-test on the isolated memory region (which is currently idle) to identify defective memory cells within the isolated memory region. For example, MBIST module 106 can generate test patterns to be stored into the memory region, read data stored in the memory region, and compare the read data with the generated test pattern. Various testing algorithms can be used by MBIST module 106. The scope of the disclosure is not limited by the MBIST algorithm. In conventional approaches, MBIST is applied to an entire memory module that is idle. Consequently, a conventional MBIST module does not need to consider the range of addresses for applying the self-test. However, MBIST module 106 needs to only apply the self-test on the quiesced memory region. Compared with conventional MBIST modules, MBIST module 106 can include additional logic that defines the location and range of the memory region to which the self-test is applied. In some embodiments, MBIST module 106 can include an address-ranging module that defines the location and range of a to-be-tested memory region. More specifically, the address-ranging module can include a base-address register defining a base address of the to-be-tested memory region and a range register defining the range of the to-be-tested memory region.

PPR module 108 can perform repair on defective memory cells detected by MBIST module 106. As discussed previously, memory array 102 includes redundant or spare rows and columns of memory cells and fusible multiplexers. Based on the addresses of the defective cells and the implemented redundancy scheme, PPR module 108 can compute a repair scheme and can subsequently replace the defective memory cells with redundant cells by applying high voltage pulses at certain fusible multiplexers Like MBIST, conventional PPR schemes are often applied to an entire memory module, not an isolated memory region, whereas PPR module 108 is configured to apply the repair operation only in a specified memory region. Hence, similar to MBIST module 106, PPR module 108 also includes an address-ranging module that defines the location and range of a to-be-repaired memory region.

Figure 2:
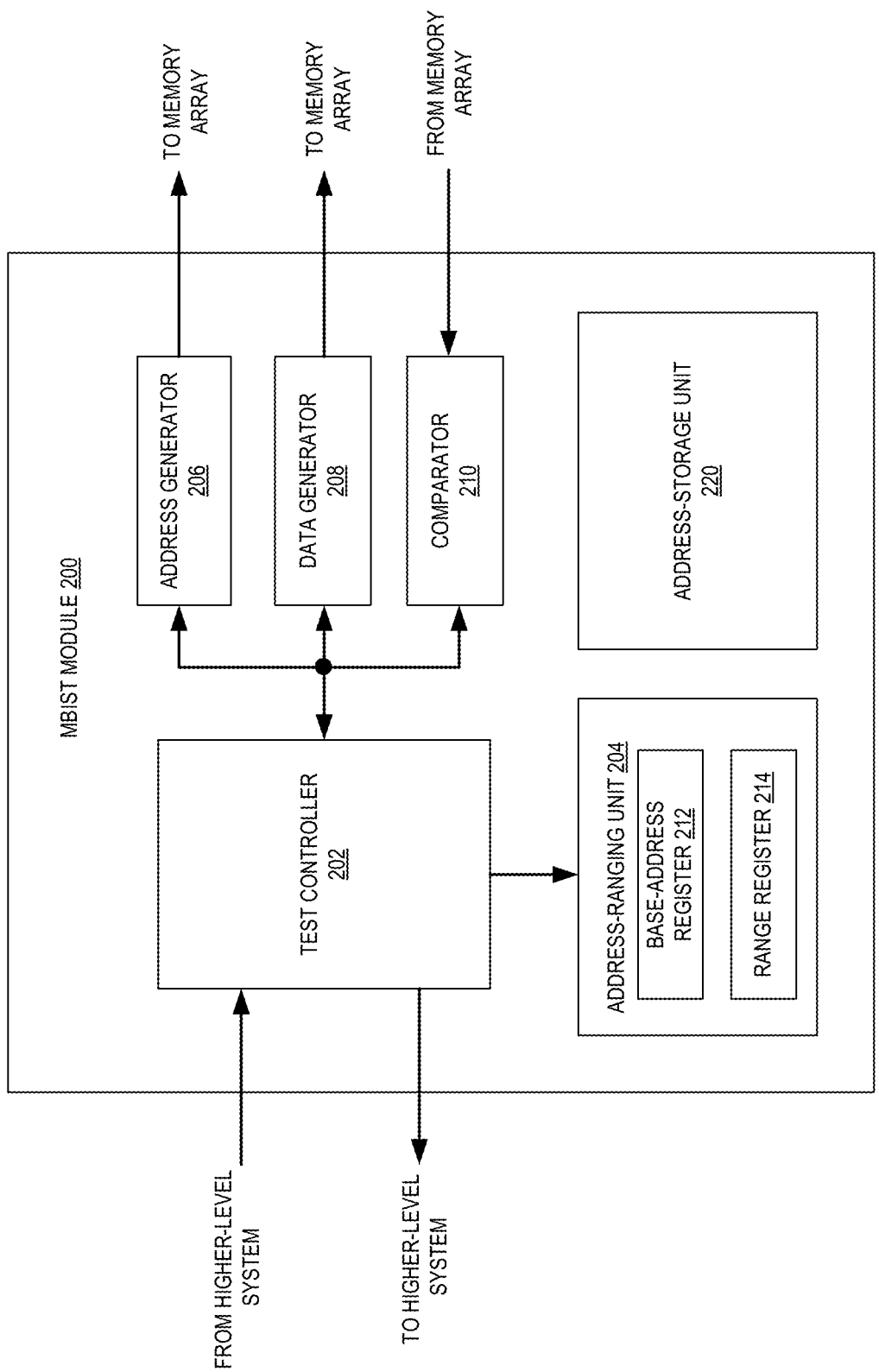
FIG. 2 illustrates an exemplary memory built-in self-test (MBIST) module, according to one embodiment.

FIG. 2 illustrates an exemplary memory built-in self-test (MBIST) module, according to one embodiment. MBIST module 200 includes a test controller 202, an address-ranging unit 204, an address generator 206, a data generator 208, a comparator 210, and an address-storage unit 220. MBIST module 200 is responsible for performing MBIST operations on a particular memory region that has been quiesced or isolated. MBIST module 200 can act as an interface between the memory array and the higher-level system managing the memory (e.g., the memory driver or the management module of the memory platform). More specifically, the higher-level system sends a command to test controller 202 within MBIST module 200 to initiate MBIST operations. In one embodiment, the command can include address information of the to-be-tested memory region. Test controller 202 parses the received command and passes the address information to address-ranging unit 204.

Address-ranging unit 204 can be responsible for defining the location and range of the to-be-tested memory region. In one embodiment, address-ranging unit 204 can include a base-address register 212 storing a base address of the to-be-tested memory and a range register 214 storing a range of addresses of the to-be-tested memory region.

Address generator 206 generates addresses of memory cells based on the address information stored in base-address register 212 and range register 214. Data generator 208 generates testing data patterns corresponding to the addresses of memory cells according to predetermined testing algorithms. The generated testing data patterns are stored into the memory cells having the corresponding addresses. Comparator 210 is responsible for comparing data stored in the memory cells and the generated data. More specifically, comparator 210 can read the data stored in the memory cells and compare the read data with the data generated by data generator 208. Inconsistencies between the read data and the generated data may indicate defective memory cells. In one embodiment, addresses of the detected defective memory cells can be stored in address-storage unit 220.

Figure 3:
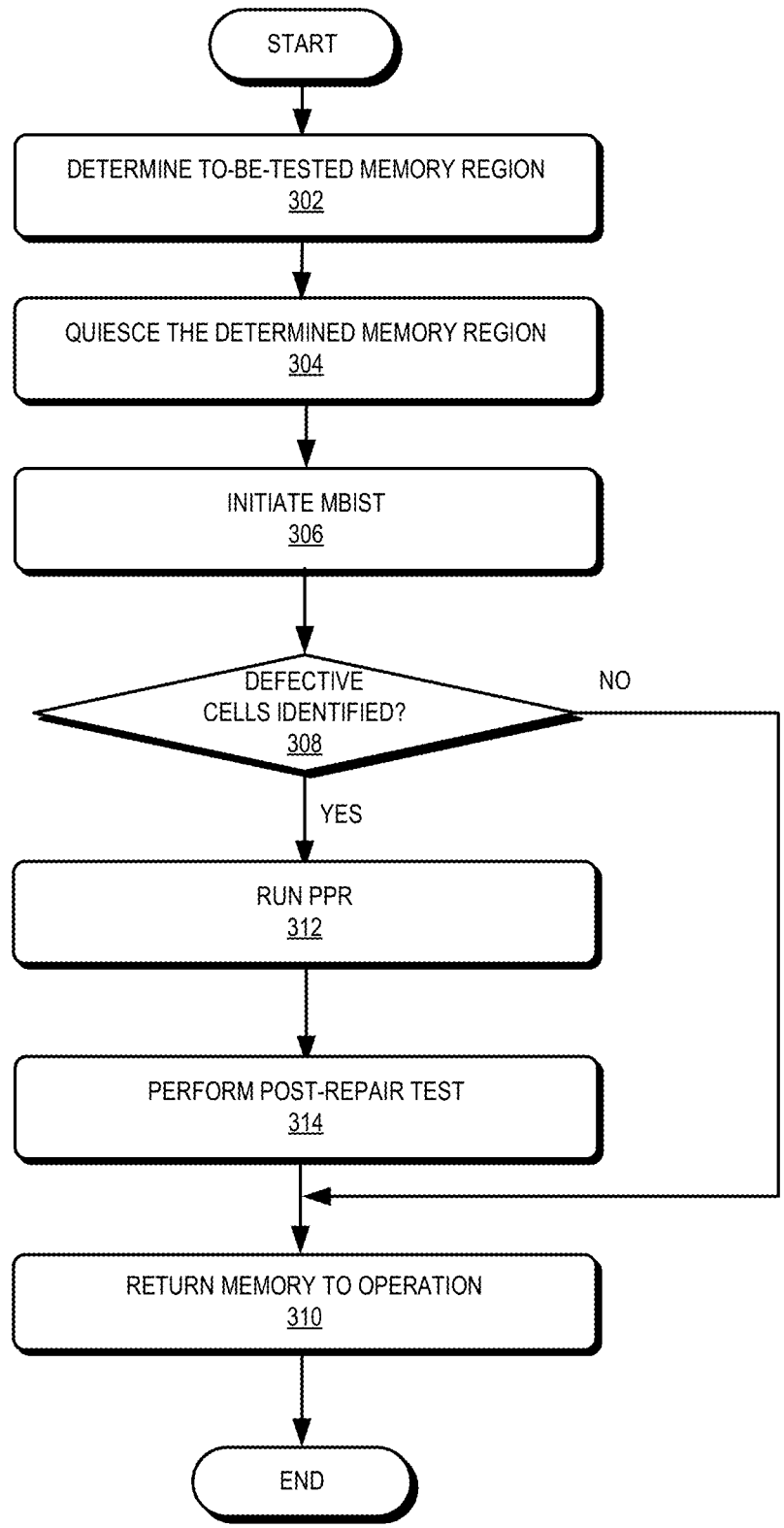
FIG. 3 presents a flowchart illustrating an exemplary process for performing self-test and repair on a memory module, according to one embodiment.

FIG. 3 presents a flowchart illustrating an exemplary process for performing self-test and repair on a memory module, according to one embodiment. During operation, the test-and-repair system (or simply the system) determines a to-be-tested memory region within the memory module (operation 302). The to-be-tested memory region can be determined on demand, in response to detecting a correctable or uncorrectable error. For example, when the memory controller receives a read or write error, it may indicate that a correctable error occurs at a particular memory cell. An uncorrectable error occurs when two errors are reported for the same memory cell. Based on the address of the memory cell reporting the error, the system can determine the to-be-tested memory region such that the to-be-tested memory region includes the memory cell reporting the error. In one embodiment, the to-be-tested memory region can be determined such that the suspected faulty cell is substantially at the center of the memory region. In alternative embodiments, the to-be-tested memory region can be determined based on a preset schedule. For example, the system can periodically walk through the entire memory module region by region to perform self-test and make repairs when needed, in a way similar to the automatic refresh operations routinely performed on memories. The size of the determined to-be-tested memory region can be fixed or configurable. In one example, the size of a to-be-tested memory region can be around a few megabytes. In another example, the size of a to-be-tested memory region is configured dynamically to be about 1% of the currently available memory.

The system can then quiesce the determined memory region (operation 304). Once quiesced, the memory region is isolated from other memory regions and is no longer accessible to the operating system. The request to quiesce a memory region can be issued or handled by various hardware, firmware, or software modules managing the memory. For example, the management software of the platform, to which the memory is attached, can interact with control logic on the memory to quiesce a particular region or regions in the memory. Alternatively, the BIOS of the host system can quiesce the determined memory region.

Subsequently, the system initiates the MBIST operation on the memory region that is now idle (operation 306). Similarly, various hardware, firmware, or software modules can interact with the MBIST controller embedded in the memory to start the MBIST operation on the particular memory region. In one example, the memory driver can send a command to the MBIST controller, and the command can include address information (e.g., the beginning and ending addresses) associated with the to-be-tested memory region. In another example, a memory-management application executed in the host system of the memory can issue the command to the MBIST controller, triggering the MBIST controller to perform the self-test on a memory region specified by the command.

Based on the test result, the system determines if defective memory cells are identified (operation 308). If not, the system returns the memory region to operation (operation 310). For scheduled testing, the system can move on to the next memory region to perform self-test.

If defective memory cells are identified, the system runs a PPR process to replace the defective memory cells with redundant cells included in the memory (operation 312). In fact, the entire row where the defective cell is located can be replaced with a spare row of memory cells. Note that the PPR process can be a slower hard PPR process that applies a permanent fix to the defective cells. Alternatively, the PPR process can also be a soft PPR (SPPR) that applies a temporary fix to the defective cells. With soft PPR, instead of fusing the fusible multiplexers, the system simply maps the address of a defective row to a spare row. This temporary fix can be converted to permanent (e.g., by fusing the fusible multiplexers) at the next reboot, which may occur on a scheduled basis. More specifically, after each SPPR process, the system records the location of the repair. At the next scheduled reboot, the PPR controller converts the soft fixes to permanent fixes.

After the PPR process, the system performs a post-repair test to verify the correctness of the repair (operation 314), and the memory region is returned to operation (operation 310).

As memory technology continues to evolve, on-die ECC has become part of the standard for DDR5, making it possible to hide or mask single-bit errors in the memory array from the upper level system. However, the accumulation of those single-bit errors will eventually cause problems for customers. When the single-bit errors are hidden from the upper level system, it is difficult to perform MBIST on demand. Regularly scheduled MBIST and PPR routines are more useful to detect and fix defective cells in a timely fashion. In the examples shown in FIGS. 1-3, the self-test and the subsequent repair are performed on a memory region that is idle. In other words, in order to test and/or repair a particular memory region, the system needs to first "unplug" that particular memory region. Although the memory as a whole remains in operation, the particular memory region is taken out of service while being tested or repaired. However, taking memory regions out of service on a regular base may negatively affect the performance of the memory. To solve this problem, in some embodiments, the test-and-repair system shown in FIGS. 1-3 can be enhanced to allow the test and repair to be performed in the background, without interrupting normal memory operations even to the tested region.

Figure 4:
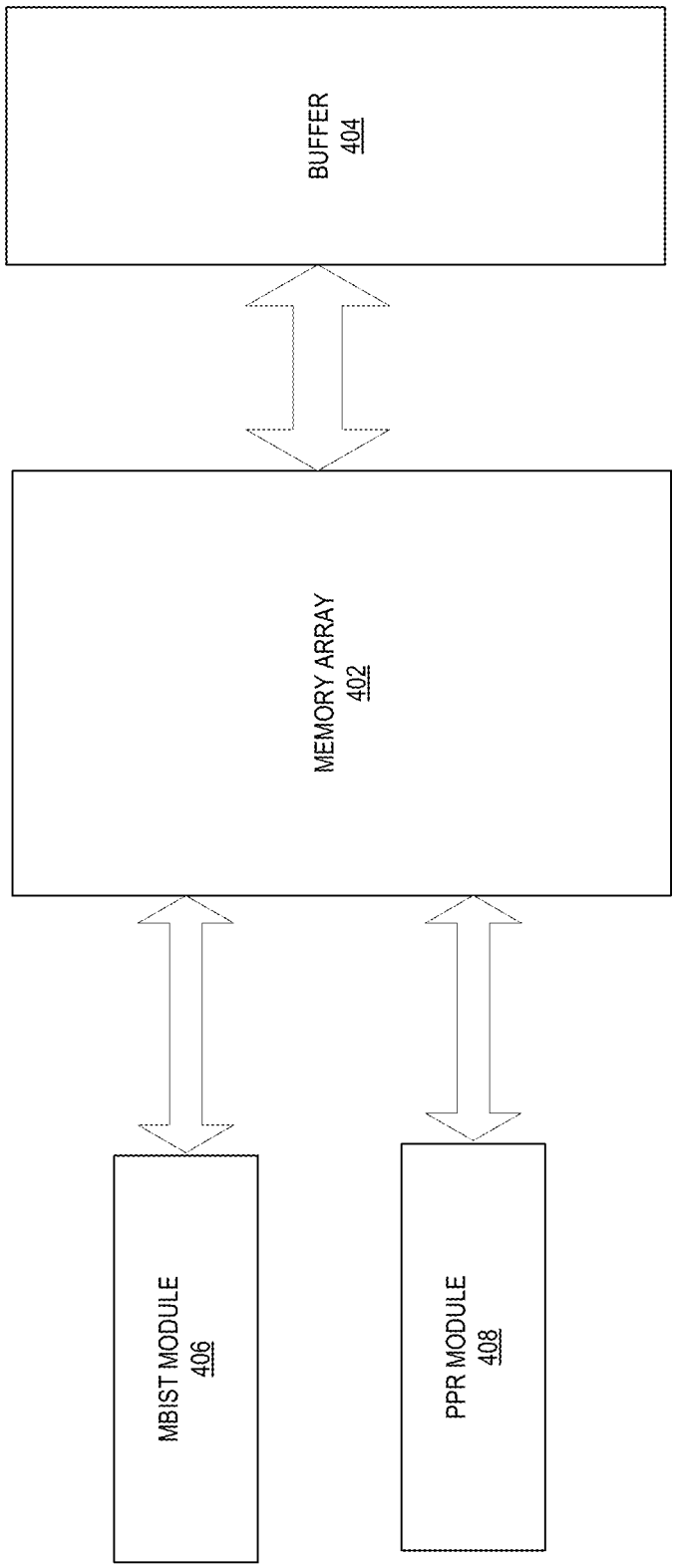
FIG. 4 illustrates an exemplary memory module, according to one embodiment.

FIG. 4 illustrates an exemplary memory module, according to one embodiment. In FIG. 4, memory module 400 can include a memory array 402, a buffer 404, an MBIST module 406, and a PPR module 408. Memory array 402, MBIST module 406, and PPR module 408 can be similar, respectively, to memory array 102, MBIST module 106, and PPR module 108 shown in FIG. 1. Buffer 404 can be implemented using various data storage techniques. In some embodiments, buffer 404 can in fact be a designated memory region within memory array 402. In alternative embodiments, buffer 404 can be independent of memory array 402. The size of buffer 404 (i.e., the amount of data that can be stored in buffer 404) can vary depending on implementation. In one embodiment, the size of buffer 404 can be determined based on the total size of memory module 400 or memory array 402. For example, the size of buffer 404 can be between 0.5 and 5% of memory module 400.

Including buffer 404 in memory module 400 allows the contents of a to-be-tested memory region to be temporarily stored in buffer 404 while the memory region undergoes testing and repair. The address of the memory region can be mapped to buffer 404 such that memory-access operations directed to the memory region are now directed to buffer 404. This way, normal memory operations are not disrupted when the memory region is tested and repaired. In some embodiments, a self-test and repair routine can be done in the background in a way similar to a refresh cycle that walks through the memory.

There is an additional benefit of including a buffer in the memory module, which is to extend its self repair capability. Although there are built-in redundant memory cells, their number can be limited and may run out when the number of defective cells increases over time or when the size of a defective region is relatively large. In such a situation, available buffer space can be used to replace the defective memory cells.

Figure 5:
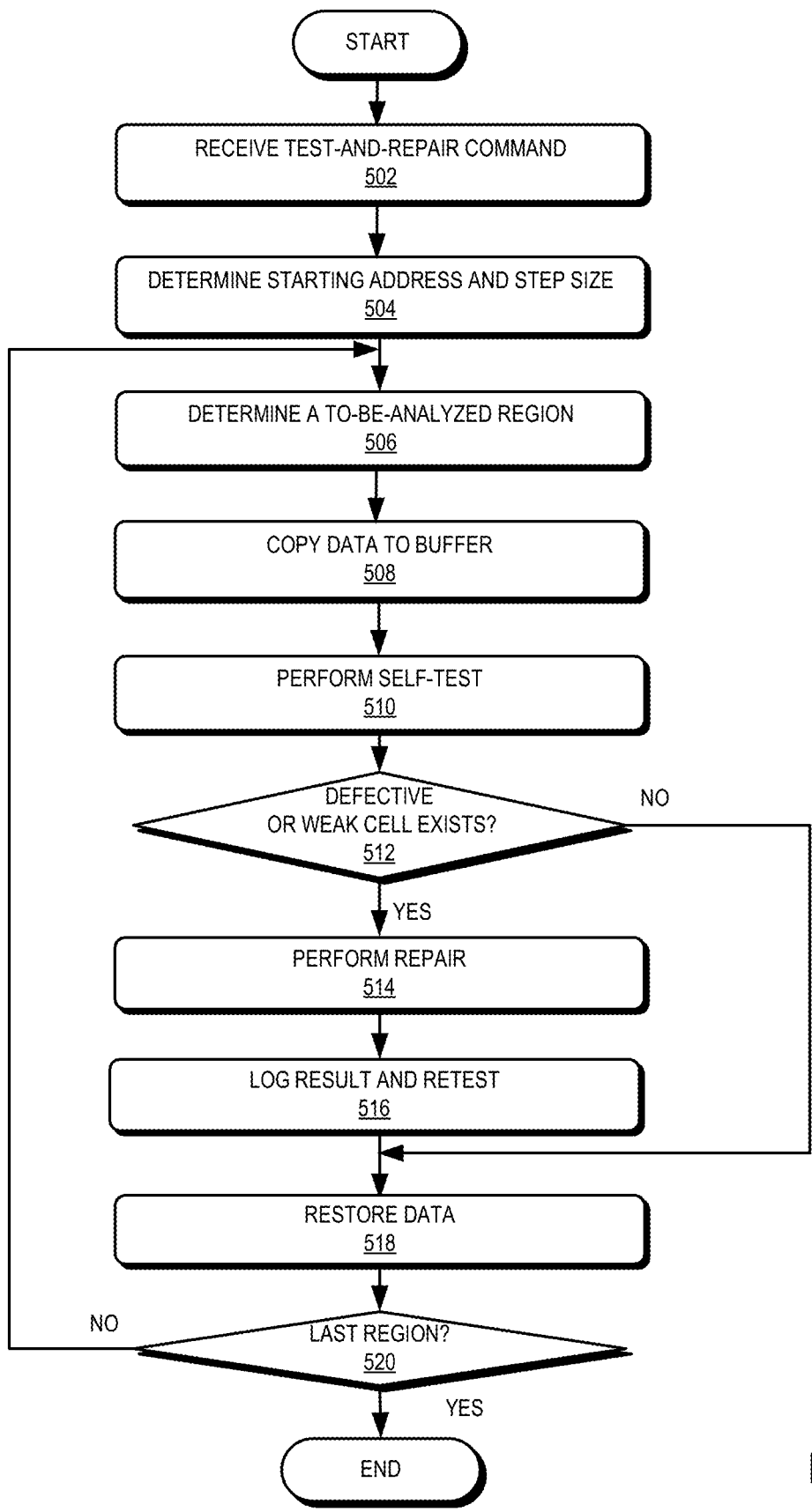
FIG. 5 presents a flowchart illustrating an exemplary process for performing self-test and repair on a memory module, according to one embodiment.

FIG. 5 presents a flowchart illustrating an exemplary process for performing self-test and repair on a memory module, according to one embodiment. During operation, the system receives a test-and-repair command, which initiates the test-and-repair operation with an initial timing (operation 502). The system determines a starting address and the size of the walking step, i.e., the size of the memory region that is analyzed at each step (operation 504). In some embodiments, the size of the step can be the same as the number of rows being refreshed in each step of the walking refresh. In alternative embodiments, the size of the step can be configurable and can be determined based on the size of the available buffer. For example, the size of the step can be the size of the available buffer or half the size of the available buffer.

The system determines a to-be-analyzed memory region based on the starting address and the size of the step (operation 506). Subsequently, data stored in the to-be-analyzed memory region is copied to the buffer (operation 508). Note that when the data stored in the to-be-analyzed memory region is copied to the buffer, the physical address of this memory region is mapped to the address of the buffer, such that memory-access operations (e.g., read or write) directed to this memory region will be redirected to the buffer, thus allowing normal memory operations to be performed on this memory region when it undergoes testing and repair. By copying the stored data to the buffer, the to-be-analyzed memory region is now ready for testing. Compared with the process shown in FIG. 3, this operation for preparing the memory region for testing does not prevent the operating system from accessing data stored in the memory region. From the point of view of the operating system, the to-be-analyzed memory region continues to be available. However, in the process shown in FIG. 3, when preparing the memory region for testing, the memory region is quiesced and becomes inaccessible to the operating system.

After the stored data is copied to the buffer, self-test is performed on this particular memory region (operation 510). In one embodiment, the self-test can include a MBIST operation. Performing the MBIST operation can include generating test patterns according to one or more MBIST algorithms, storing the test patterns into the memory region under testing, reading the stored data, and comparing the stored data with the generated test patterns. Based on the comparison result, the system can determine if defective or weak cells exist in the memory region under testing (operation 512). If the system does not identify any defective or weak cells in the tested memory region, the data previously stored in the memory region is restored (operation 518). More specifically, the data can be copied back to the memory region from the buffer.

If a defective or weak cell is detected and located in the memory region, the system performs a repair (e.g., by replacing the defective or weak cell with a spare cell) (operation 514). In one embodiment, the system identifies a row that has one or more defective cells and replaces the entire row with a spare row. The repair can be a permanent repair where the built-in repair circuit applies high voltage pulses to fusible multiplexers to permanently replace the memory cells. Alternatively, the repair can be a soft repair that only maps the addresses of defective cells to those of the spare cells, and the soft repair can become permanent at the next system reboot.

Subsequent to the repair, the result (including the location of the defective cell and the location of the spare cell) is logged and the repaired memory region is tested again to verify its correctness (operation 516). After retesting, the system restores the data previously stored in the memory region (operation 518). Once the data is copied back from the buffer to the memory region, the address mapping between the memory region and the buffer is deleted. Memory-access operations (e.g., write and read) directed to the memory region can carry on as normal.

After the completion of the testing and possible repair on the current memory regions, the system determines if the current memory region is the last region in the module under testing (operation 520). If so, the process ends. If not, the system moves on to the next memory region (operation 506).

In FIG. 5, the process is triggered by a test-and-repair command and ends after the entire memory module is tested region by region. In practice, it is also possible that the entire process can be performed automatically on a schedule (e.g., once a day or once a week). The test-and-repair operation is running in the background and is invisible from any application that uses the storage module.

Figure 6:
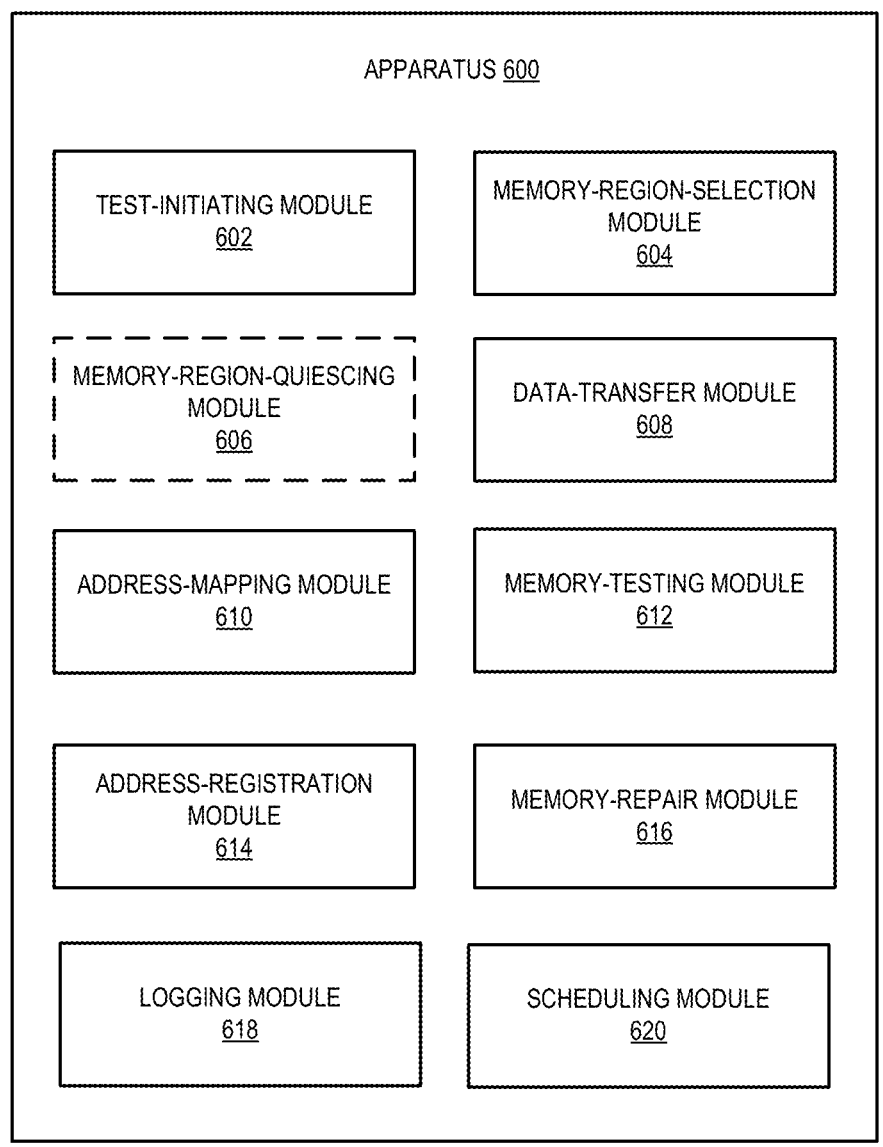
FIG. 6 illustrates an exemplary apparatus that facilitates automatic test-and-repair of a memory module, according to one embodiment.

FIG. 6 illustrates an exemplary apparatus that facilitates automatic test-and-repair of a memory module, according to one embodiment. Apparatus 600 can comprise a plurality of units or apparatuses, which may communicate with one another via a wired, wireless, quantum light, or electrical communication channel. Apparatus 600 may be realized using one or more integrated circuits (e.g., ASICs), and may include fewer or more units or apparatuses than those shown in FIG. 6. Furthermore, apparatus 600 may be integrated in a computer system, or realized as a separate device or devices capable of communicating with other computer systems and/or devices. Apparatus 600 interacts with a memory array (e.g., a DRAM array) to facilitate testing and repairing of the memory array.

In FIG. 6, apparatus 600 can include a test-initiating module 602, a memory-region-selection module 604, an optional memory-region-quiescing module 606, a data-transfer module 608, an address-mapping module 610, a memory-testing module 612, an address-registration module 614, a memory-repair module 616, a logging module 618, and a scheduling module 620.

Test-initiating module 602 can be responsible for initiating the test-and-repair routine. In some embodiments, test-initiating module 602 initiates the test-and-repair routine on demand in response to detecting correctable and/or uncorrectable errors in the memory array. In alternative embodiments, test-initiating module 602 initiates the test-and-repair routine according to a predetermined schedule (e.g., according to a predetermined maintenance schedule).

Memory-region-selection module 604 can be responsible for selecting a memory region within the memory for testing. The selection can be based on the location of a detected error or based on a predetermined test plan, where the memory array is tested region by region. Memory-region-quiescing module 606 can be responsible for quiescing the selected memory region. Once quiesced, the selected memory region becomes invisible and inaccessible to the operating system. When the memory module includes a built-in buffer (e.g., a designated region is used as a data buffer), the selected memory region is not quiesced. Instead, data stored in the selected memory region can be copied to the buffer by data-transfer module 608, and the address of the selected memory region can be mapped to the buffer by address-mapping module 610. This way, access to the selected memory region can be directed to the buffer. From the point of view of the operating system, the memory region is still active and accessible.

Memory-testing module 612 can be responsible for performing a self-test on the selected memory module. Compared with a conventions MBIST process used to test an entire memory module that is idle, memory-testing module 612 can be configured such that only the selected memory region (which is either idle or has had its data copied to the buffer) is tested. Address-registration module 614 records the address of any defective or weak memory cells identified by memory-testing module 612.

Memory-repair module 616 can perform PPR on memory cells specified by addresses recorded in address-registration module 614. In some embodiments, memory-repair module 616 can perform permanent repair on the memory cells (e.g., by fusing a fusible multiplexer to replace a defective row using a spare row). In an alternative embodiment, memory-repair module 616 can perform a soft PPR first, and the soft repair will be converted to a permanent repair at the next system reboot. Logging module 618 can be responsible for logging the testing and repair outcome (e.g., locations of defective cells and the redundant cells used for repair). Scheduling module 620 can be responsible for scheduling testing and repair operations. In some embodiments, scheduling module 620 can schedule periodic testing and repair operations to be performed on the memory module.

Figure 7:
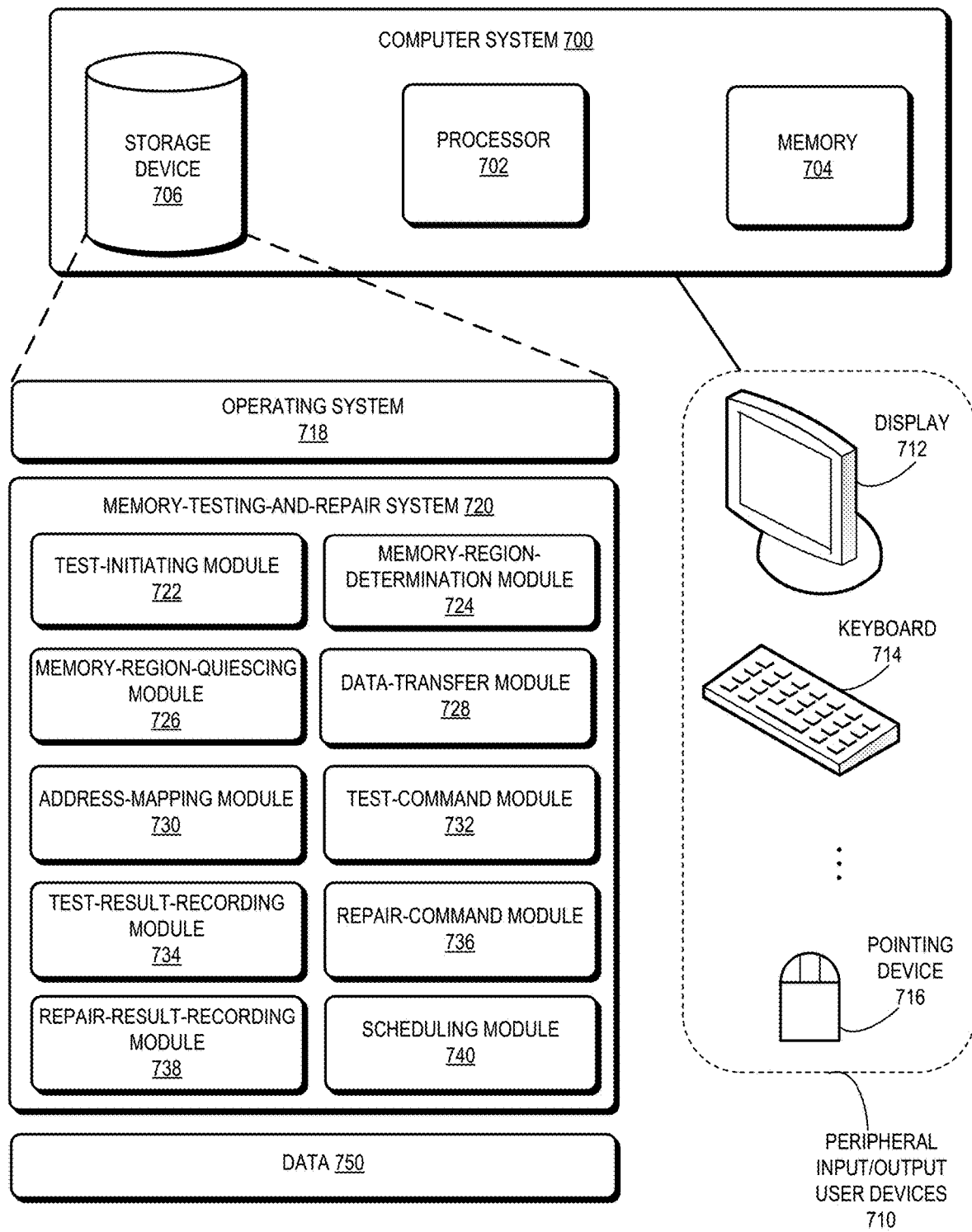
FIG. 7 illustrates an exemplary computer system that facilitates the self-test and repair of a memory module, according to one embodiment.

FIG. 7 illustrates an exemplary computer system that facilitates the self-test and repair of a memory module, according to one embodiment. Computer system 700 includes a processor 702, a memory 704, and a storage device 706. Furthermore, computer system 700 can be coupled to peripheral input/output (I/O) user devices 710, e.g., a display device 712, a keyboard 714, and a pointing device 716. Storage device 706 can store an operating system 718, a memory-testing-and-repair system 720, and data 750. Memory-testing-and-repair system 720 can be used to facilitate self-testing and repair on memory 704.

Memory-testing-and-repair system 720 can include instructions, which when executed by computer system 700, can cause computer system 700 or processor 702 to perform methods and/or processes described in this disclosure. Specifically, memory-testing-and-repair system 720 can include instructions for initiating self-test on memory 704 (test-initiating module 722), instructions for determining a to-be-tested memory region within memory 704 (memory-region-determination module 724), instructions for quiescing the determined memory region (memory-region-quiescing module 726), instructions for transferring data between the to-be-tested memory region and a data buffer when memory 704 includes a buffer (data-transfer module 728), instructions for mapping the address of the to-be-tested memory region to the buffer address (address-mapping module 730), instructions for generating and sending a memory-testing command to the self-test controller embedded in memory 704 (test-command module 732), instructions for recording the test result (test-result-recording module 734), instructions for generating and sending a repair command to the PPR controller embedded in memory 704 (repair-command module 736), instructions for recording the repair result (repair-result-recording module 738), and instructions for scheduling testing-and-repair operations (scheduling module 740).

In general, the disclosed embodiments provide a method and system that enables in-situ self-test and repair of a memory. By modifying the MBIST function and PPR function built in a memory module, individual regions within the memory module can be tested while the entire memory is still running or in operation. In some embodiments, the memory region can be quiesced using a memory hot-plug technique, and a testing-and-repair routine (e.g., a combination of MBIST and PPR operations) can be performed on the quiesced memory region. After the testing and, if needed, the repair, the memory region is returned to the operating system for operation. In some embodiments, the memory module may include a built-in data buffer configured to temporarily store data in a to-be-tested memory region. After data is copied from the to-be-tested memory region to the buffer, the testing-and-repair routine can be run on the to-be-tested memory region. During this time, access to this memory region can be directed to the buffer. After the testing and repair operation, the data is copied back to the memory region from the buffer.

One embodiment provides a memory module that enables online repair of defective memory cells. The memory module includes a memory array storing data, a self-test controller coupled to the memory array and configured to perform a self-test on a region within the memory array without interrupting operations of the memory module, and a memory-repair module configured to repair a defective memory cell identified by the self-test controller.

In a variation on this embodiment, the memory module further includes a memory-region-quiescing controller configured to quiesce the region within the memory array such that the region is not accessible to a processor coupled to the memory module.

In a further variation, the memory-region-quiescing controller is configured to unquiesce the region to allow the region to be accessed by the processor, subsequent to the memory-repair module repairing the defective memory cell.

In a variation on this embodiment, the self-test controller comprises a first register storing a base address of the region and a second register storing an address range.

In a variation on this embodiment, the memory module further comprises a data buffer. Data stored in the region is copied to the data buffer before the self-test controller performs the self-test on the region, and an address associated with the region is mapped to an address of the data buffer.

In a further variation, the data buffer is configured to restore data in the region subsequent to the memory-repair module repairing the defective memory cell.

In a variation on this embodiment, the memory module further comprises a scheduler configured to schedule the self-test performed by the self-test controller based on a predetermined maintenance schedule.

In a variation on this embodiment, the self-test controller is configured to perform the self-test in response to a detected error in the memory array.

In a variation on this embodiment, the memory-repair module repairs the defective memory cell by replacing a memory row that includes the defective memory cell with a spare memory row.

In a variation on this embodiment, the memory-repair module is configured to: perform a permanent repair on the defective memory cell, or perform a soft repair on the defective memory cell.

One embodiment provides a system and method for online repair of defective memory cells. During operation, the system determines a memory region within a memory module, prepares the memory region for subsequent testing and repair, performs a self-testing operation on the memory region without interrupting operations of the memory module, and repairs the defective memory cell, in response to the self-testing operation identifying a defective memory cell.

In a variation on this embodiment, preparing the memory region comprises quiescing the memory region within the memory array such that the memory region is not accessible to a processor coupled to the memory module.

In a further variation, subsequent to repairing the defective memory cell, the system unquiesces the memory region to allow the memory region to be accessed by the processor.

In a variation on this embodiment, preparing the memory region further comprises storing a base address of the memory region in a first register and storing an address range in a second register.

In a variation on this embodiment, the system copies data stored in the memory region to a data buffer before performing the self-test operation on the region and maps an address associated with the region to an address of the data buffer.

In a further variation, subsequent to repairing the defective memory cell, the system restores data in the memory region based on the data buffer.

In a variation on this embodiment, the system schedules the self-test based on a predetermined maintenance schedule.

In a variation on this embodiment, the self-test is performed in response to a detected error in the memory array.

In a variation on this embodiment, repairing the defective memory cell comprises replacing a memory row that includes the defective memory cell with a spare memory row.

In a variation on this embodiment, repairing the defective memory cell comprises: performing a permanent repair on the defective memory cell; or performing a soft repair on the defective memory cell.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium.

Furthermore, the methods and processes described above can be included in hardware modules or apparatus. The hardware modules or apparatus can include, but are not limited to, application-specific integrated circuit (ASIC) chips, field-programmable gate arrays (FPGAs), dedicated or shared processors that execute a particular software module or a piece of code at a particular time, and other programmable-logic devices now known or later developed. When the hardware modules or apparatus are activated, they perform the methods and processes included within them.

The foregoing descriptions of embodiments have been presented for purposes of illustration and description only. They are not intended to be exhaustive or to limit the scope of this disclosure to the forms disclosed. Accordingly, many modifications and variations will be apparent to practitioners skilled in the art.

What is claimed is:

1. A memory module, comprising:
   a memory array storing data;
   a memory-region-quiescing controller configured to quiesce, during operations of the memory module and in response to determining that a memory region within the memory array is to be tested, the to-be-tested memory region such that the to-be-tested memory region is not accessible to a processor coupled to the memory module;
   a self-test controller coupled to the memory array and configured to perform a self-test on the to-be-tested memory region without interrupting the operations of the memory module; and
   a memory-repair module configured to repair a defective memory cell identified by the self-test controller.

2. The memory module of claim 1, wherein the memory-region-quiescing controller is configured to:
   subsequent to the memory-repair module repairing the defective memory cell, unquiesce the previously quiesced memory region to allow the previously quiesced memory region to be accessed by the processor.

3. The memory module of claim 1, wherein the self-test controller comprises a first register storing a base address of the to-be-tested memory region and a second register storing an address range.

4. The memory module of claim 1, further comprising a data buffer, wherein data stored in the to-be-tested memory region is copied to the data buffer before the self-test controller performs the self-test on the to-be-tested memory region, and wherein an address associated with the to-be-tested memory region is mapped to an address of the data buffer.

5. The memory module of claim 4, wherein the data buffer is configured to restore data in the memory region subsequent to the memory-repair module repairing the defective memory cell.

6. The memory module of claim 1, further comprising a scheduler configured to schedule the self-test performed by the self-test controller based on a predetermined maintenance schedule.

7. The memory module of claim 1, wherein the self-test controller is configured to perform the self-test in response to a detected error in the memory array.

8. The memory module of claim 1, wherein the memory-repair module repairs the defective memory cell by replacing a memory row that includes the defective memory cell with a spare memory row.

9. The memory module of claim 1, wherein the memory-repair module is configured to:
   perform a permanent repair on the defective memory cell; or
   perform a soft repair on the defective memory cell.

10. A method for online repair of defective memory cells, the method comprising:
    during operations of a memory module, in response to determining that a memory region within the memory module is to be tested, preparing the to-be-tested memory region for subsequent testing and repair, which comprises quiescing the to-be-tested memory region such that the to-be-tested memory region is not accessible to a processor coupled to the memory module;
    performing a self-test operation on the to-be-tested memory region without interrupting the operations of the memory module; and
    in response to the self-test operation identifying a defective memory cell, repairing the defective memory cell.

11. The method of claim 10, further comprising:
    subsequent to repairing the defective memory cell, unquiescing the previously quiesced memory region to allow the previously quiesced memory region to be accessed by the processor.

12. The method of claim 10, wherein preparing the to-be-tested memory region further comprises storing a base address of the memory region in a first register and storing an address range in a second register.

13. The method of claim 10, comprising:
    copying data stored in the to-be-tested memory region to a data buffer before performing the self-test operation on the to-be-tested memory region; and
    mapping an address associated with the to-be-tested memory region to an address of the data buffer.

14. The method of claim 13, further comprising:
    subsequent to repairing the defective memory cell, restoring data in the memory region based on the data buffer.

15. The method of claim 10, further comprising scheduling the self-test operation based on a predetermined maintenance schedule.

16. The method of claim 10, wherein the self-test operation is performed in response to a detected error in the memory module.

17. The method of claim 10, wherein repairing the defective memory cell comprises replacing a memory row that includes the defective memory cell with a spare memory row.

18. The method of claim 10, wherein repairing the defective memory cell comprises:
   performing a permanent repair on the defective memory cell; or
   performing a soft repair on the defective memory cell.

* * * * *